United States Patent
Gorczyca et al.

(10) Patent No.: US 6,255,137 B1
(45) Date of Patent: Jul. 3, 2001

(54) METHOD FOR MAKING AIR POCKETS IN AN HDI CONTEXT

(75) Inventors: Thomas Bert Gorczyca, Schenectady; Herbert Stanley Cole, Burnt Hills, both of NY (US)

(73) Assignee: Lockheed Martin Corp., Moorestown, NJ (US)

( * ) Notice: Subject to any disclaimer, the term of this patent is extended or adjusted under 35 U.S.C. 154(b) by 0 days.

(21) Appl. No.: 09/340,240

(22) Filed: Jul. 1, 1999

(51) Int. Cl.$^7$ .................................................. H01L 21/44
(52) U.S. Cl. .......................... 438/112; 438/51; 438/618; 438/619
(58) Field of Search ................................ 438/112, 50, 51, 438/618, 619

(56) References Cited

U.S. PATENT DOCUMENTS

| | | | |
|---|---|---|---|
| 5,338,975 | 8/1994 | Cole, Jr. et al. | 257/750 |
| 5,373,627 | * 12/1994 | Grebe | 438/107 |
| 5,561,085 | 10/1996 | Gorowitz et al. | 437/209 |
| 5,757,072 | 5/1998 | Gorowitz et al. | 257/700 |
| 5,798,557 | * 8/1998 | Salatino et al. | 257/416 |
| 5,824,177 | * 10/1998 | Yoshihara et al. | 438/460 |
| 6,071,427 | * 6/2000 | Raulinaitis | 438/21 |

* cited by examiner

Primary Examiner—Kevin M. Picardat
(74) Attorney, Agent, or Firm—W. H. Meise; S. D. Weinstein

(57) ABSTRACT

A method for making an HDI-connected circuit is described, which in a simple manner allows an air pocket, space, gap, or bubble to be formed over pressure- or dielectric-sensitive portions of a semiconductor chip. The method applies a layer of uncured adhesive over a dielectric film, and also over any electrical conductors deposited on the film. The adhesive is exposed through a mask to a laser beam, which selectively vaporizes the adhesive in the exposed regions, to define the air pocket region. The semiconductor chips are applied, electrode-side down, on the adhesive, with the sensitive regions registered with the pockets. The adhesive is cured, and conductive vias are formed through the dielectric film and the adhesive to make contact with the electrodes of the semiconductor chips. Other layers of HDI interconnect are then applied over the dielectric film, and interconnected by vias, if needed. Either before or after the step of making the conductive vias, the bodies of the semiconductor chips are encapsulated.

20 Claims, 4 Drawing Sheets

METHOD FOR MAKING AIR POCKETS IN AN HDI CONTEXT

FIELD OF THE INVENTION

This invention relates to high-density-interconnect (HDI) structures, and more particularly to improved methods for generating protective air pockets, spaces or gaps over pressure- or adhesive-sensitive structures on semiconductor chips used in HDI circuits.

BACKGROUND OF THE INVENTION

High-density interconnect (HDI) structures have received a great deal of attention, as a result of their advantages in fabrication of complex systems. In general, HDI structures allow the interconnection of relatively large numbers of integrated-circuit chips into complex systems in a cost-effective manner. More particularly, integrated-circuit chips are mounted on heat-conductive or heat-sinking substrates, with their interconnection electrodes or pads lying in a common plane. One or more layers of dielectric film material, patterned with interconnection conductors, are placed over the chips to be interconnected, and connection vias are defined through the dielectric layers to interconnect the chips with the electrically conductive interconnection pattern on the film.

Various aspects of HDI structures and fabrication are defined in U.S. Pat. No. 5,338,975, entitled High Density Interconnect Structure Including A Spacer Structure And A GAP, issued Aug. 16, 1994 in the name of Cole et al., and in U.S. Pat. Nos. 5,561,085 and 5,757,072, entitled Structures for Protecting Air Bridges On Semiconductor Chips From Damage, issued May 26, 1998 in the name of Gorowitz et al. More particularly, these patents describe arrangements for protecting sensitive portions of semiconductor chips from damage due to the presence of interconnection film in HDI structures. Such sensitive portions of semiconductor chips may include airbridge structures, which are liable to be crushed, and transmission-line or resonant structures, the properties of which may be affected by proximity to dielectric materials. These prior techniques for generating protective regions for protecting sensitive regions of the semiconductor chips are effective, but may be too complex for use under some conditions, or too expensive. In particular, some protective techniques required the individual placement of protective caps over sensitive portions of each of the chips before the application of the HDI interconnect layers.

Improved methods for making HDI-connected structures are desired.

SUMMARY OF THE INVENTION

A method for making an HDI circuit with integral air pocket according to an aspect of the invention includes the step of applying an adhesive layer to one side of a dielectric film to form an adhesive-coated film. At locations on the adhesive-coated film selected to register with the locations of pressure or adhesive-sensitive structures or portions of one or more semiconductor chips which is (or are) to be mounted on the film, ablating the adhesive layer on the adhesive-coated film, to define adhesive-free regions. Once the adhesive-free regions are defined, the chip and the film are relatively moved toward each other in an atmosphere, with the pressure- or adhesive-sensitive regions of the chip registered with the adhesive-free regions of the film, to thereby attach the chip to the film. This results in trapping of a bubble of gas of the atmosphere In a region lying over the pressure- or adhesive-sensitive structures of the chip.

In a particular method according to the invention, the step of applying an adhesive layer includes the step of applying a layer of adhesive which is a blend of about 100 parts by weight of Shipley MP9500 photosensitive adhesive with 11 parts by volume Ciba-Geigy CY184 cycloaliphatic epoxy, and the step of ablating is performed with a laser operating at about 248 nanometers. In one method according to the invention, the laser is an excimer laser. One way to perform the ablation step is to pass the laser beam through a mask which defines the adhesive-free portions, and allowing the unmasked portion of the laser beam to fall on the adhesive-coated film. Different masks may be used to define the adhesive-free regions for a particular chip, if the laser beam passing through one mask is not sufficiently large to cover the desired region. Another way to perform the ablation is to scan a narrow laser beam over a mask overlying the region to be ablated. Yet another way to perform the ablation is to scan a laser over a portion of the film which includes regions to be ablated and regions which are not to be ablated, and to controllably turn the beam on and off to ablate the regions to be ablated. It is desirable to flow a gas across the region being ablated to aid in carrying away soot and any other particulates. Helium is a desirable gas for this purpose, because it is inert, and also because it tends to rise, and aids in carrying off the particulate matter. The color of the reflection of light from the region being illuminated by the laser can be used as an indication of the progress of the ablation, since ablation of the preferred adhesive generates a blue reflection, while ablation of Kapton (indicating that the ablation of adhesive has been completed) results in an orange color.

Further steps in the generation of HDI circuits include the step of defining conductive vias through the adhesive-coated film at locations of at least some electrical connection regions of a chip.

BRIEF DESCRIPTION OF THE DRAWINGS

FIG. 2b is a cross-section of a portion of the arrangement of FIG. 2a;

DESCRIPTION OF THE INVENTION

Figure 1A:
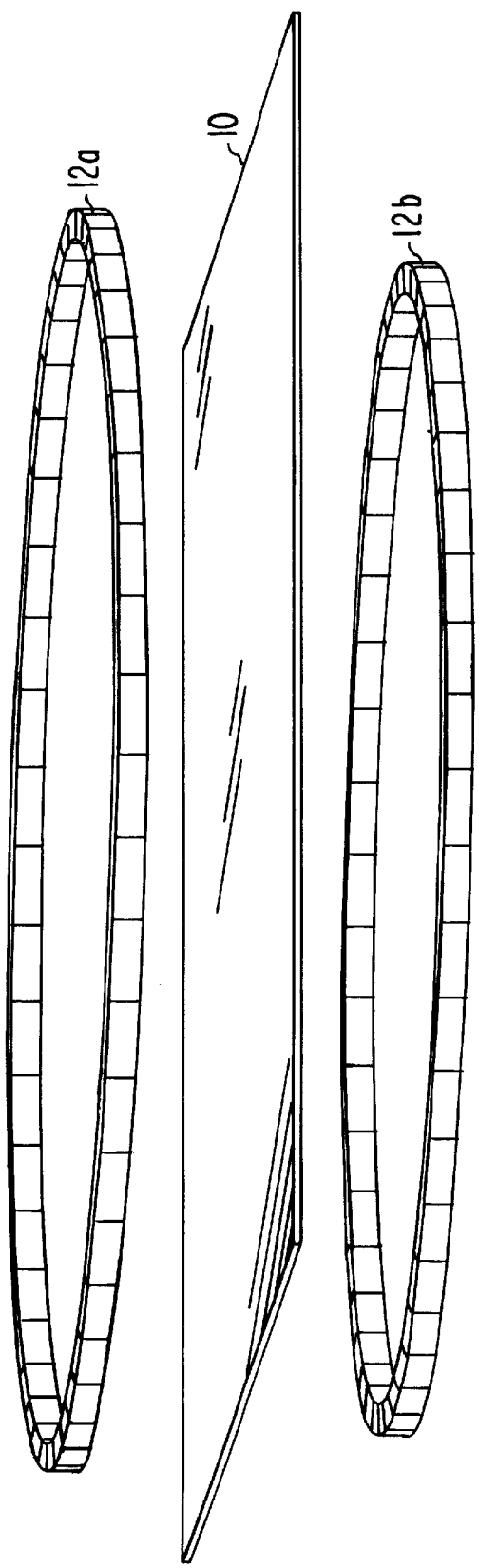
FIG. 1a is a simplified illustration of a dielectric film and a pair of snap rings.
Figure 1B:
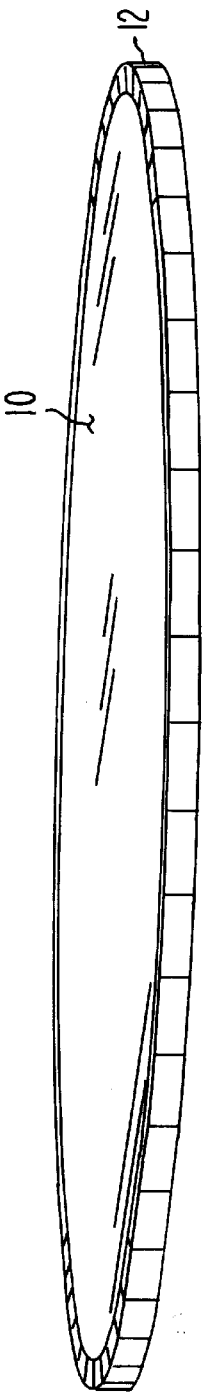
FIG. 1b is a simplified representation of the snap rings and film conjoined.
Figure 2A:
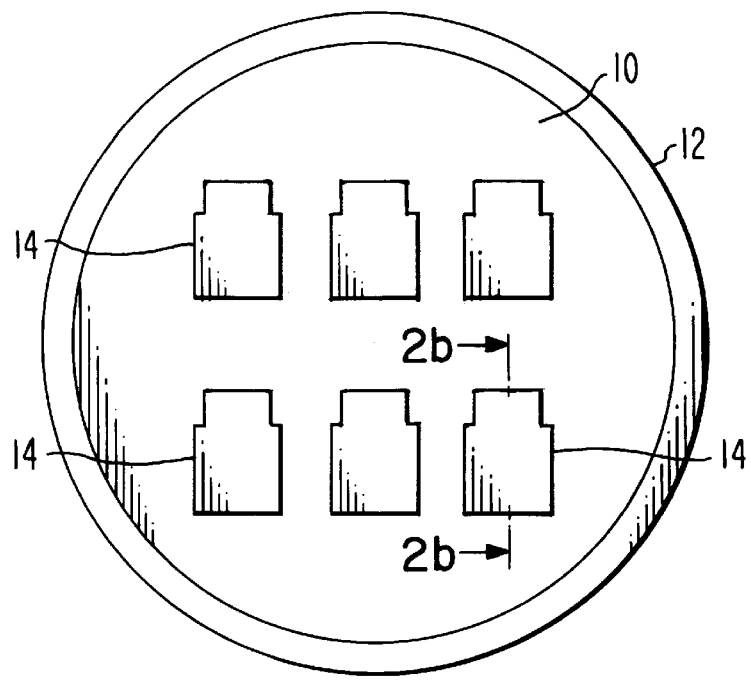
FIG. 2a is a plan view of the dielectric film of FIGS. 1 with the addition of metallizations in various regions.

In the making of HDI-interconnected structures, the chips which are to be interconnected are procured, and an interconnection pattern is defined on the dielectric interconnection film. The film most used at this time is Kapton brand polyimide film. In FIG. 1a, a layer of dielectric film is illustrated as being spaced apart from an upper large snap ring 12a and a lower smaller snap ring 12b. The snap rings are equivalent to those ordinarily used for holding woven material taut in the context of needlework. In FIG. 1b, layer 10 of dielectric film is held under tension by the conjoined pair 12 of interlocked snap rings 12a and 12b, as though it were a drumskin. FIG. 2a illustrates the tensioned dielectric film 10 with snap rings 12, after processing for adding one or more layers of electrically conductive metallizations for interconnection of semiconductor chips. In FIG. 2a, the regions containing metallizations are designated 14. Each region 14 is identical to the other regions 14, and each region 14 is intended to interconnect all of the chips of one HDI circuit. Thus, the six metallization regions 14 of FIG. 2a, when further processed as described below, and when separated from each other, will make six HDI circuits.

Figure 2B:
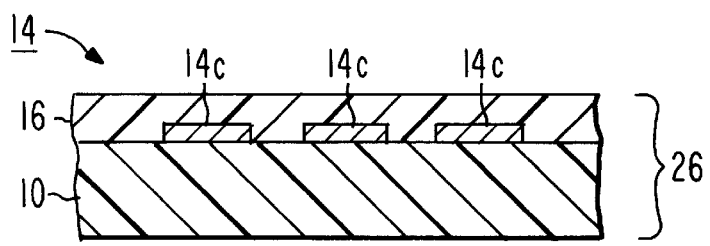

According to a step of the processing, a layer of adhesive is added over the metallization regions 14 of FIG. 2a. This adhesive material is preferably a blend of about 100 parts by weight of Shipley MP9500 photosensitive adhesive with 11 parts by weight Ciba-Geigy CY184 cycloaliphatic epoxy. A preferred method for applying the adhesive is by deposition in the center of the circular framed or hooped Kapton film, followed by spinning to distribute the adhesive to a substantially uniform thickness over the region of interest (the metallized regions). In one embodiment, the thickness of the adhesive after spinning was about 12 microns ($\mu$). FIG. 2b illustrates various conductors 14c of the metallization region 14, with a layer 16 of adhesive overlying the metallizations 14c and the polyimide layer 10 to form a layer 26 of adhesive-coated film.

Figure 3A:
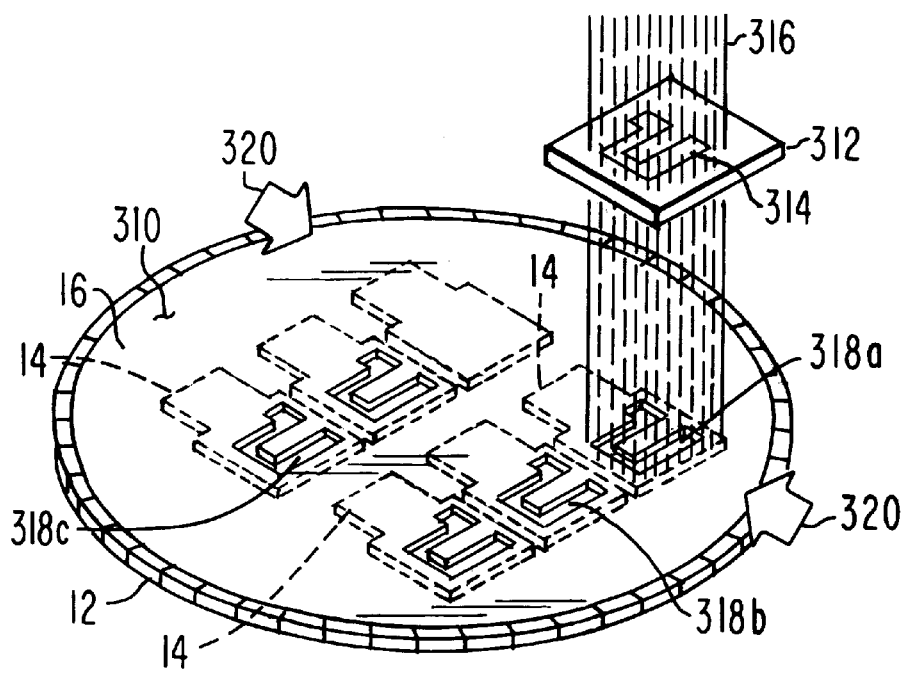
FIGS. 3a and 3b are simplified perspective or isometric views of ablation steps in accordance with an aspect of the invention.

The next step in the processing is illustrated in FIG. 3a. In FIG. 3a, 310 represents the upper surface of the adhesive film 16 which overlies the metallized regions 14. As illustrated, a transparent mask piece 312 includes an opaque layer which defines a transparent portion 314, having a shape which defines the region of the adhesive which is to be ablated. In a particular mode of the method according to the invention, the mask piece is made from quartz, which is transparent to 248 nm radiation, and the opaque portion of the mask may be metallized. As illustrated in FIG. 3a, a laser beam 316 having transverse dimensions sufficient to illuminate the transparent portion 314 of the mask is directed toward the mask and the adhesive layer overlying the dielectric film. Because the laser beam is substantially collimated (has parallel or non-diverging rays), the mask need not be at any particular location along the beam path. That portion of the laser beam which passes through the transparent portion 314 of the mask impinges on the adhesive in a region illustrated as 318a, and ablates (vaporizes) the adhesive. Region 318a is one of a plurality of such regions, some of which are designated 318b and 318c, of a set 318 of such regions which are to be formed. Consequently, the adhesive in the illuminated region 318a essentially vanishes. Consequently, the underlying upper surface of the Kapton film 10 is exposed in the ablated region 318a.

During the ablation of the adhesive material in region 318a of FIG. 3a, soot and possibly other particulate matter is generated. In order to avoid deposition of the particulate matter on the unablated regions, a flow of gas is provided from the sides, as suggested by the arrows 320 in FIG. 3a. In one embodiment of the invention, the gas is helium, which is advantageous because of its tendency to rise, which aids in the removal of particulates from the region being processed.

During ablation of the adhesive layer 16 in region 318a, the light reflected from the region being ablated has a blue appearance. When the adhesive 16 has been ablated away sufficiently to expose the underlying polyimide, the polyimide begins to ablate. The thickness of the polyimide film 10 should be sufficient to allow for some ablation, as the adhesive in the region being ablated will not be removed at the same rate, so that some portions of the region will have exposed polyimide while other regions are still coated with adhesive. For this purpose, the polyimide should be about 25$\mu$ thick. Such a thickness allows for some ablation of the polyimide, without losing excessive structural strength. When the polyimide ablates, the reflected light has an orange appearance. Thus, ablation of adhesive can continue until the ablated region is essentially orange, and free from blue reflected light.

Once the region 318a of FIG. 3a is completely ablated, the mask 312 is stepped to the next region 14 of FIG. 3a, and the process of illumination is repeated, so as to ablate a corresponding region, such as 318b, to region 318a. This stepping is repeated until all of the regions 14 have been ablated with a pattern of set 318 corresponding to 318a.

Figure 3B:
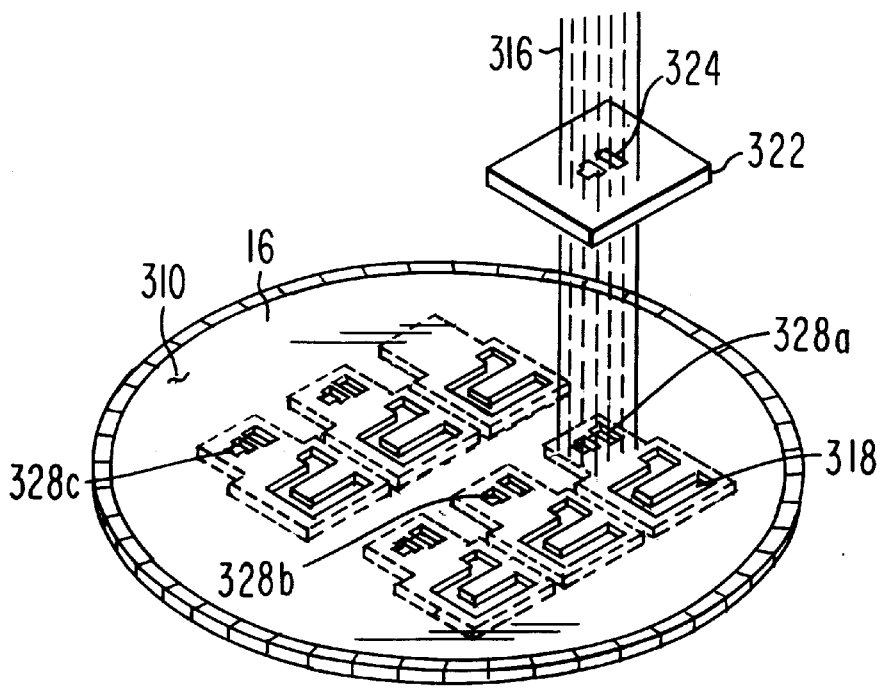

The next step in the process of forming HDI circuits is illustrated in FIG. 3b. The step illustrated in FIG. 3b is essentially the same as that described in conjunction with FIG. 3a, except that the mask, designated 322, has a different pattern, designated 324. The pattern 324 of FIG. 3b is intended to define an adhesive-free region illustrated as separated regions 328a, 318b, 318c, . . . of a set 328, which would be associated with semiconductor chip(s) other than that with which adhesive-free regions of set 318 are associated. The mask 324 is illuminated by laser beam 316, to thereby ablate the adhesive in regions 328a. When the ablation is completed, the mask 322 is stepped to the region 328b in the next region 14, and the process is repeated. The result of the steps described in conjunction with FIGS. 3a and 3b is to produce sets 318 and 328 of adhesive-free regions of adhesive layer 16, as defined by the transparent regions 314 and 324 of masks 312 and 322. As mentioned, these regions are intended to be registered with pressure- or adhesive-sensitive portions of the various semiconductor chips with which the film is to be associated.

Figure 4:
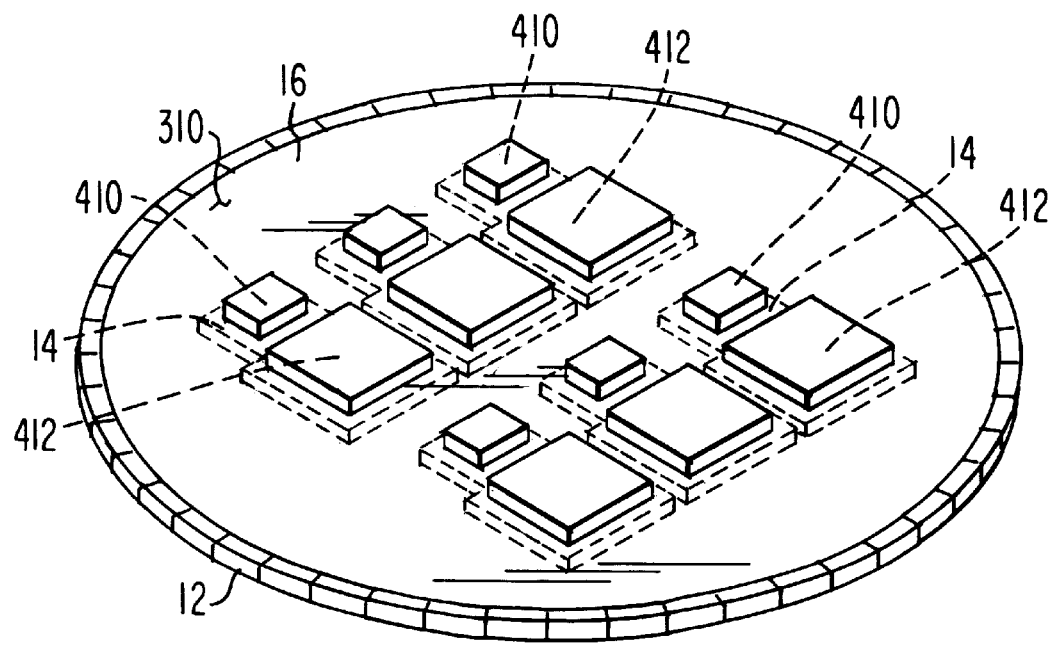
FIG. 4 is a simplified perspective or isometric view of the result of adding semiconductor chips to the structure in accordance with a step of the invention.

The next step in producing HDI circuits according to an aspect of the invention is to place the appropriate semiconductor chips on the adhesive, with the electrode-sides of the semiconductor chips "face-down" or on the adhesive. FIG. 4 illustrates the adhesive layer 16 with chips 410, 412 placed over the upper surface 310 in each of the regions 14, in proper registry with the adhesive-free regions (not visible in FIG. 4). The uncured adhesive 16 retains the chips in position. This step results in "air" pockets, spaces, gaps, or bubbles at the locations of the ablated adhesive. It is desirable that the semiconductor chips be preassembled with any spacers, shims, or heat sinks which may be required before the chips are assembled to form the structure of FIG. 4.

Following the step illustrated in FIG. 4, the entire film-with-chips arrangement, together with the snap rings, is baked to cure the adhesive. It has been found that, if the metallization layers are relatively thick, heating of the assemblage may result in localized buckling of the film as a result of differential expansion of the metal and dielectric. This buckling can be avoided by holding the film against a flat surface during baking, as by use of a vacuum plate applied to the lower side of the Kapton film, in conjunction with positive pressure applied to the upper surface 310.

Figure 5:
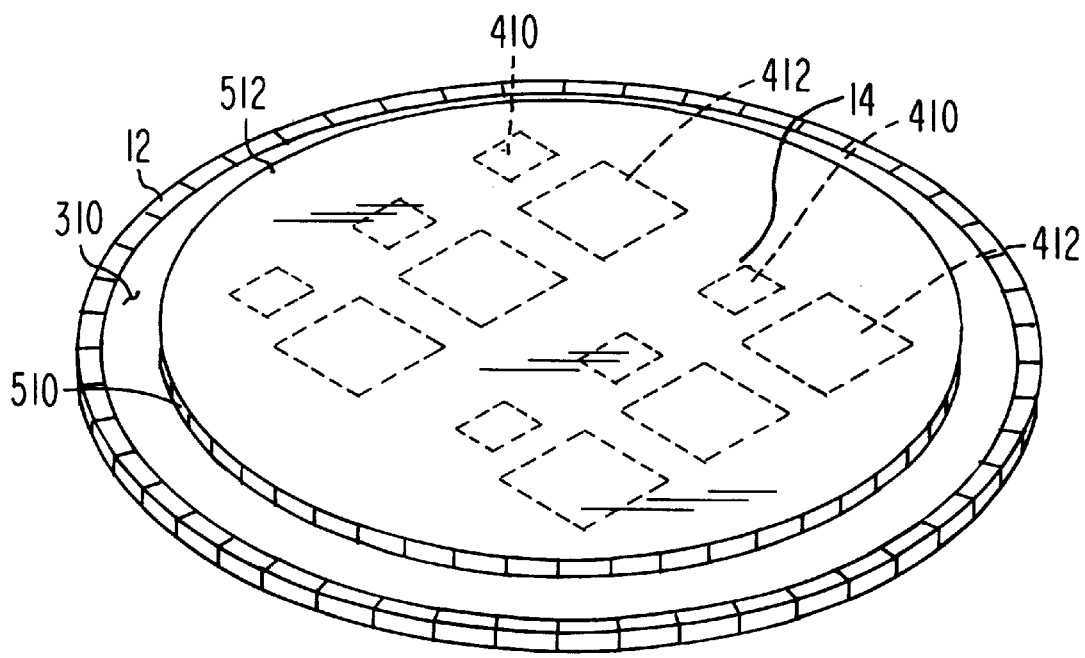
FIG. 5 is a simplified perspective or isometric view of the structure of FIG. 4, with the addition of a retaining wall and encapsulation surrounding the semiconductor chips.

FIG. 5 illustrates a further step, which involves placing a peripheral wall 510 around the region occupied by the semiconductor chips 410, 412. The region within wall 510 is filled with conventional filled-epoxy encapsulant material 512, well known for HDI purposes.

Following the step illustrated in conjunction with FIG. 5, the wall 510 is removed, and the portion including the encapsulant is separated from the snap ring 12. The structure is then turned over, and electrically conductive vias are formed through the dielectric film 10 and cured adhesive 16 at the locations at which connections are desired to the electrodes of the semiconductor chips, also as known in the art. Thereafter, further layers of film, carrying other electrically conductive patterns, may be applied over the exposed side of dielectric film layer 310, to form a multilayer HDI structure. Other steps may be performed in conventional manner as may be required for the particular application.

Figure 6:
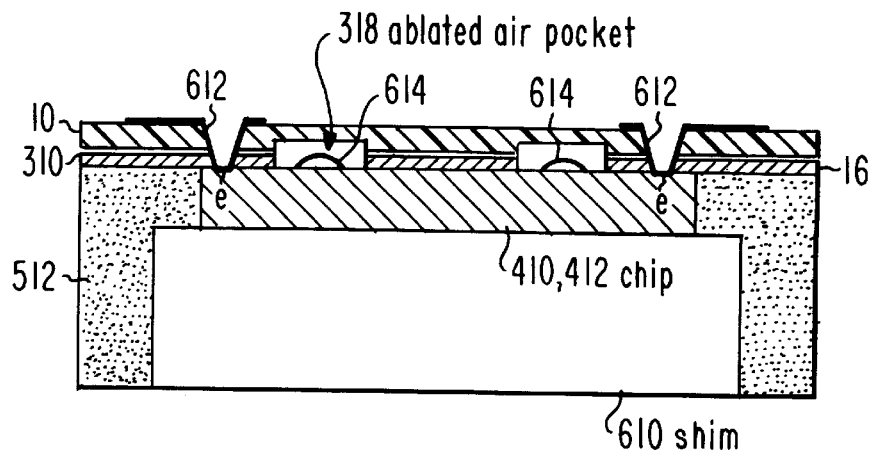
FIG. 6 is a simplified cross-sectional view of a structure made in accordance with an aspect of the invention.

FIG. 6 is a cross-section of an HDI structure made in accordance with an aspect of the invention. In FIG. 6, the underlying polyimide layer is designated 10, the adhesive layer is designated 16 and its upper surface 310, the ablated region in the adhesive and polyimide is designated 318, the heat-spreading shim attached to the semiconductor chip 410 or 412 is designated 610, and the encapsulant is designated 512. Also illustrated in FIG. 6 is a pair of electrically conductive vias 612 extending through the film 10 and adhesive 16 to make contact with electrodes, designated "e" of chip 410, 412. Also in FIG. 6, an air bridge 614 associated with the chip 410, 412 represents the pressure-sensitive structure which is protected by the air pocket 318.

Other embodiments of the invention will be apparent to those skilled in the art. For example, while ablation of the preferred adhesive has been successful at a laser wavelength of 248 nm, other wavelengths may also be used, and different wavelengths may be more advantageous for other types of adhesives. In one embodiment of the method, the collimated beam leaving the laser is reduced in cross-sectional dimensions by focussing before impingement on the region to be ablated; the mask may be in either the larger or smaller cross-sectional portions of the beam.

Thus, a method for making an HDI-connected circuit is described, which in a simple manner allows an air pocket, space, gap, or bubble (318) to be formed over pressure- or dielectric-sensitive portions (614) of a semiconductor chip (410, 412) or other sensitive devices such as micro mechanical devices. The method applies a layer (16) of uncured adhesive over a dielectric film (10), and also over any electrical conductors (14c) deposited on the upper surface (310) of the dielectric film (10). The adhesive (16) is exposed through a mask (312, 322) to a laser beam (316), which selectively vaporizes the adhesive (16) in the exposed regions (318, 328), to define the air pocket region. The semiconductor chips (410, 412) are applied, electrode-side (e) down, on the adhesive (16), with the sensitive regions registered with the pockets (318). The adhesive (16) is cured, and conductive vias (612) are formed through the dielectric film (10) and the adhesive (16) to make contact with the electrodes (e) of the semiconductor chips (410, 412). Other layers (not illustrated) of HDI interconnect are then applied over the dielectric film in the usual manner, and interconnected by vias, if needed. Either before or after the step of making the conductive vias, the bodies of the semiconductor chips (410, 412) are encapsulated by encapsulant material (512).

More particularly, a method for making an HDI circuit (FIG. 6) with integral air pocket (318) according to an aspect of the invention includes the step of applying an adhesive layer (16) to one side of a dielectric film (10) to form an adhesive-coated film (26). At locations (318, 328) on the adhesive-coated film (26) selected to register with the locations of pressure or adhesive-sensitive structures (614) or portions of one or more semiconductor chips (410, 412) which is (or are) to be mounted on the film, ablating the adhesive layer (16) on the adhesive-coated film (26), to define adhesive-free regions (sets 318, 328). Once the adhesive-free regions (318, 328) are defined, the chip(s) (410, 412) and the film (10, 16) are relatively moved toward each other in an atmosphere, with the pressure- or adhesive-sensitive regions (614) of the chip (410, 412) registered with the adhesive-free regions (318, 328) of the film (10, 16), to thereby attach the chip (410, 412) to the film. This results in trapping of a bubble of gas of the atmosphere in a region lying over the pressure- or adhesive-sensitive structures of the chip (410, 412).

In a particular method according to the invention, the step of applying an adhesive layer includes the step of applying a layer of adhesive which is a blend of about 100 parts by weight of Shipley MP9500 photosensitive adhesive with 11 parts by weight Ciba-Geigy CY184 cycloaliphatic epoxy, and the step of ablating is performed with a laser operating at Liz about 248 nanometers. In one method according to the invention, the laser is an excimer laser. One way to perform the ablation step is to pass the laser beam (316) through a mask (312) which defines the adhesive-free portions, and allowing the unmasked portion (314, 324) of the laser beam (316) to fall on the adhesive-coated film (26). Different masks (312) may be used to define the adhesive-free regions (318, 328) for a particular chip (410, 412), if the laser beam (316) passing through one mask (312) is not sufficiently large to cover the desired region. Another way to perform the ablation is to scan a narrow laser beam (316) over a mask (312) overlying the region to be ablated. Yet another way to perform the ablation is to scan a laser over a portion of the film which includes regions to be ablated and regions which are not to be ablated, and to controllably turn the beam (316) on and off to ablate the regions to be ablated. It is desirable to flow a gas (320) across the region being ablated to aid in carrying away soot and any other particulates. The color of the reflection of light from the region being illuminated by the laser can be used as an indication of the progress of the ablation, since ablation of the preferred adhesive generates a blue reflection, while ablation of Kapton (indicating that the ablation of adhesive has been completed) results in an orange color.

Further steps in the generation of HDI circuits include the step (FIG. 6) of defining conductive vias (612) through the adhesive-coated film (26) at locations of at least some electrical connection regions (e) of a chip (410, 412). Helium is a desirable gas, because it is inert, and also because it tends to rise, and aids in carrying off the particulate matter.

What is claimed is:

1. A method for making an HDI circuit with integral air pocket, said method comprising the steps of:

applying an adhesive layer to one side of a dielectric film to form an adhesive-coated film;

at locations selected to register with the locations of pressure or adhesive-sensitive structures on a semiconductor chip, ablating said adhesive layer on said adhesive-coated film to define adhesive-free regions;

relatively moving said chip and said film toward each other in a gaseous atmosphere, with said pressure- or adhesive-sensitive regions of said chip registered with said adhesive-free regions of said film, to thereby attach said chip to said film, whereby a portion of said gas of said atmosphere is trapped in a bubble lying over said pressure- or adhesive-sensitive structures of said chip.

2. A method according to claim 1, wherein said step of applying an adhesive layer includes the step of applying a layer of adhesive which is a blend of about 100 parts by weight of Shipley MP9500 photosensitive adhesive with 11 parts by weight Ciba-Geigy CY184 cycloaliphatic epoxy; and said step of ablating is performed with a laser operating at about 248 nanometers.

3. A method according to claim 1, wherein said step of ablating includes the step of passing a laser beam through a mask which defines said adhesive-free portions, and allowing the unmasked portion of said laser beam to fall on said adhesive-coated film.

4. A method according to claim 1, wherein said chip defines electrical connection regions adjacent said adhesive layer; and further comprising the step of:

defining conductive vias through said adhesive-coated film at locations of at least some of said electrical connection regions.

5. A method according to claim 1, further comprising the step of:

in conjunction with said step of ablating, generating a flow of gas across the region being ablated, to aid in removing particulate matter.

6. A method according to claim 5, wherein said step of generating a flow of gas includes the step of generating a flow of helium gas.

7. A method according to claim 1, further comprising the step of monitoring the color of the region being ablated, and continuing said ablation so long as the reflection from the region include blue portions, and discontinuing said ablation when the region being ablated has become orange.

8. A method according to claim 14, further comprising the initial step, before said step of applying a layer of adhesive, of applying an electrically conductive pattern to said film.

9. A method according to claim 14, wherein said step of applying a layer of adhesive includes the step of spin-coating said film with said adhesive.

10. A method according to claim 9, wherein said step of applying a layer of adhesive includes the step of applying about $12\mu$ of said adhesive to said film.

11. A method according to claim 14, further comprising the step, following said step of relatively moving said chip and said film toward each other, of curing said adhesive.

12. A method according to claim 15, further comprising the step, following said step of relatively moving said chip and said film toward each other, of curing said adhesive by thermal baking at elevated temperature.

13. A method according to claim 12, further comprising the step, concurrent with said step of curing by thermal baking, of curing at elevated pressure.

14. A method for making an HDI circuit with integral air pocket, said method comprising the steps of:

applying an adhesive layer to one side of a dielectric film to form an adhesive-coated film;

at locations selected to register with the locations of pressure or adhesive-sensitive structures on a semiconductor chip, ablating said adhesive layer on said adhesive-coated film to define adhesive-free regions;

without placing any protective cap over said pressure- or adhesive-sensitive regions of said chip, relatively moving said chip and said film toward each other in a gaseous atmosphere, with said pressure- or adhesive-sensitive regions of said chip registered with said adhesive-free regions of said film, to thereby attach said chip to said film, whereby gas of said atmosphere is trapped in a film bubble lying over said pressure- or adhesive-sensitive structures of said chip, and said film bubble itself is a protective cap.

15. A method according to claim 14, wherein said step of ablating is performed with a laser.

16. A method according to claim 14, wherein said step of ablating includes the step of passing a laser beam through a mask which defines said adhesive-free portions, and allowing the unmasked portion of said laser beam to fall on said adhesive-coated film.

17. A method according to claim 14, wherein said chip defines electrical connection regions adjacent said adhesive layer; and further comprising the step of:

defining conductive vias through said adhesive-coated film at locations of at least some of said electrical connection regions.

18. A method according to claim 14, further comprising the step of:

in conjunction with said step of ablating, generating a flow of gas across the region being ablated, to aid in removing particulate matter.

19. A method according to claim 18, wherein said step of generating a flow of gas includes the step of generating a flow of helium gas.

20. A method according to claim 14, further comprising the step of monitoring the color of the region being ablated, and continuing said ablation so long as the reflection from the region include blue portions, and discontinuing said ablation when the region being ablated has become orange.

* * * * *